US012342017B2

United States Patent
Garvey et al.

(10) Patent No.: US 12,342,017 B2
(45) Date of Patent: *Jun. 24, 2025

(54) ADAPTIVE VIDEO SLEW RATE FOR VIDEO DELIVERY

(71) Applicant: ARRIS Enterprises LLC, Horsham, PA (US)

(72) Inventors: Kevin Garvey, Cork (IE); Yair Neugeboren, Netanya (IL); Humphrey Looney, Cork (IE); Stephen Graham Dunning, Cork (IE); Christopher T. Harrison, Cork (IE); Damien Tuffy, Cork (IE)

(73) Assignee: ARRIS Enterprises LLC, Horsham, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/584,979

(22) Filed: Feb. 22, 2024

(65) Prior Publication Data
US 2024/0196028 A1 Jun. 13, 2024

Related U.S. Application Data

(63) Continuation of application No. 17/989,622, filed on Nov. 17, 2022, now Pat. No. 11,943,494, which is a
(Continued)

(51) Int. Cl.
*H04N 21/242* (2011.01)
*H03K 5/156* (2006.01)
(Continued)

(52) U.S. Cl.
CPC ......... *H04N 21/242* (2013.01); *H03K 5/1565* (2013.01); *H04N 21/23406* (2013.01); *H04N 21/4305* (2013.01); *H04N 21/44004* (2013.01)

(58) Field of Classification Search
CPC .......... H04N 21/23406; H04N 21/238; H04N 21/242; H04N 21/4302; H04N 21/4305; H04N 21/44004; H03K 5/1565
See application file for complete search history.

(56) References Cited

U.S. PATENT DOCUMENTS 5,841,771 A * 11/1998 Irwin ................. H04Q 11/0478
370/383
6,357,028 B1 * 3/2002 Zhu ..................... H04N 21/6377
714/751
(Continued)

OTHER PUBLICATIONS

DVB Organization: "CM-SP-R-DEPI-102-151001.pdf" DVB, Digital Video Broadcasting, C/O EBU—17A Ancienne Route—CH-1218 Grand Saconnex, Geneva—Switzerland, Oct. 5, 2015 (Oct. 5, 2015), XP017847413, Chapter 5.3.2.1; p. 23; figures 5-1, 5-3.
(Continued)

*Primary Examiner* — Michael B. Pierorazio
(74) *Attorney, Agent, or Firm* — Chernoff, Vilhauer, McClung & Stenzel, LLP

(57) ABSTRACT

Systems and methods for adaptively adjusting a slew rate of a dejitter buffer in a remote device in a distributed access architecture. The slew rate may be adjusted based on measurements of a fullness state of a buffer made over time. The measurements may be used to calculate a frequency offset value between the rate at which data leaves the buffer relative to the rate at which data enters the buffer and/or used to calculate a current working depth of the buffer. The adaptive slew rate adjustments may be based on the frequency offset value and/or the current working depth.

10 Claims, 5 Drawing Sheets

Related U.S. Application Data continuation of application No. 17/590,365, filed on Feb. 1, 2022, now Pat. No. 11,533,526.

(60) Provisional application No. 63/144,367, filed on Feb. 1, 2021.

(51) Int. Cl.
*H04N 21/234* (2011.01)
*H04N 21/43* (2011.01)
*H04N 21/44* (2011.01)

(56) References Cited

U.S. PATENT DOCUMENTS

| | | | | |
|---|---|---|---|---|
| 6,396,850 B1* | 5/2002 | de Vito | H04N 7/1675 | 348/E7.056 |
| 6,665,345 B1* | 12/2003 | Sekiguchi | H04N 19/66 | 375/E7.279 |
| 6,980,731 B1* | 12/2005 | Tahara | H04N 21/43632 | 386/E9.036 |
| 6,983,323 B2* | 1/2006 | Cantrell | H04L 69/22 | 709/225 |
| 7,617,509 B1* | 11/2009 | Brunheroto | H04N 17/004 | 725/19 |
| 7,760,826 B2* | 7/2010 | Chang | H04L 25/03019 | 375/346 |
| 7,778,173 B2* | 8/2010 | Tse | H04N 21/64322 | 370/230.1 |
| 7,983,268 B1* | 7/2011 | Wingfield | H04B 1/66 | 370/537 |
| 8,279,884 B1* | 10/2012 | Narasimha | H04L 47/365 | 370/410 |
| 8,284,259 B2* | 10/2012 | Karacali-Akyamac | H04L 43/024 | 348/180 |
| 8,620,275 B2* | 12/2013 | Minear | H04N 21/812 | 725/62 |
| 9,203,498 B2* | 12/2015 | Ohayon | H04L 69/324 | |
| 10,735,120 B1* | 8/2020 | Kantharaju | H04L 43/087 | |
| 2002/0053053 A1* | 5/2002 | Nagai | H04L 1/205 | 375/E7.016 |
| 2002/0196363 A1* | 12/2002 | Furusawa | H04N 21/4344 | 348/461 |
| 2003/0051254 A1* | 3/2003 | Weidenfeller | H04L 65/613 | 725/98 |
| 2004/0105463 A1* | 6/2004 | Cheung | H04L 1/0001 | 370/468 |
| 2004/0153940 A1* | 8/2004 | Yu | H03M 13/2957 | 714/746 |
| 2005/0100100 A1* | 5/2005 | Unger | H04N 21/6373 | 375/E7.134 |
| 2005/0120124 A1* | 6/2005 | Korhonen | H04L 1/18 | 714/746 |
| 2005/0180415 A1* | 8/2005 | Cheung | H04N 21/6437 | 348/E7.071 |
| 2005/0262529 A1* | 11/2005 | Neogi | H04N 21/63345 | 725/31 |
| 2007/0053303 A1* | 3/2007 | Kryuchkov | H04L 43/0852 | 370/252 |
| 2008/0075031 A1* | 3/2008 | Ohayon | H04N 21/6143 | 370/316 |
| 2008/0192119 A1* | 8/2008 | Li | H04N 21/44209 | 348/180 |
| 2008/0259962 A1* | 10/2008 | Mori | H04N 21/4305 | 375/E7.278 |
| 2009/0158326 A1* | 6/2009 | Hunt | H04N 5/783 | 725/38 |
| 2009/0276821 A1* | 11/2009 | Amento | H04N 21/44226 | 725/116 |
| 2010/0080305 A1* | 4/2010 | Guo | H04N 21/4382 | 375/E7.279 |
| 2010/0091888 A1* | 4/2010 | Nemiroff | H04N 19/115 | 375/E7.154 |
| 2011/0222669 A1* | 9/2011 | Buriano | H04L 65/752 | 379/32.01 |
| 2012/0042091 A1* | 2/2012 | McCarthy | H04N 21/812 | 709/231 |
| 2012/0116758 A1* | 5/2012 | Murgia | G10L 19/24 | 704/226 |
| 2013/0028121 A1* | 1/2013 | Rajapakse | H04N 21/40 | 370/252 |
| 2013/0044803 A1* | 2/2013 | Fisher | H04N 21/8455 | 709/231 |
| 2013/0089140 A1* | 4/2013 | Kudana | H04N 19/152 | 375/240.03 |
| 2013/0340023 A1* | 12/2013 | Yoshimoto | H04N 21/6375 | 725/116 |
| 2014/0013342 A1* | 1/2014 | Swan | H04N 21/4821 | 725/92 |
| 2014/0233587 A1* | 8/2014 | Liu | H04L 47/782 | 370/468 |
| 2015/0082366 A1* | 3/2015 | French | H04N 21/6371 | 725/116 |
| 2015/0189394 A1* | 7/2015 | French | H04L 65/611 | 725/109 |
| 2015/0295669 A1* | 10/2015 | Chapman | H04L 27/345 | 370/503 |
| 2016/0165266 A1* | 6/2016 | Bocharnikov | H04N 21/242 | 725/109 |
| 2016/0261896 A1* | 9/2016 | Bocharnikov | H04N 21/23424 | |
| 2016/0295254 A1* | 10/2016 | Chen | H04N 21/23406 | |
| 2017/0111686 A1* | 4/2017 | Quere | H04N 21/8547 | |
| 2017/0302378 A1* | 10/2017 | Mutalik | H04L 12/2856 | |
| 2018/0295050 A1* | 10/2018 | Lee | H04L 43/04 | |
| 2019/0014050 A1* | 1/2019 | Wang | H04L 49/9005 | |
| 2019/0116057 A1* | 4/2019 | Colson | H04L 12/2801 | |
| 2019/0207690 A1* | 7/2019 | Mäki | H04Q 11/00 | |
| 2019/0327499 A1* | 10/2019 | Poli | H04N 21/2353 | |
| 2022/0053491 A1* | 2/2022 | Sevindik | H04W 72/0453 | |

OTHER PUBLICATIONS

International Search Report and Written Opinion RE: Application No. PCT/US2022/014755, dated May 16, 2022.

* cited by examiner

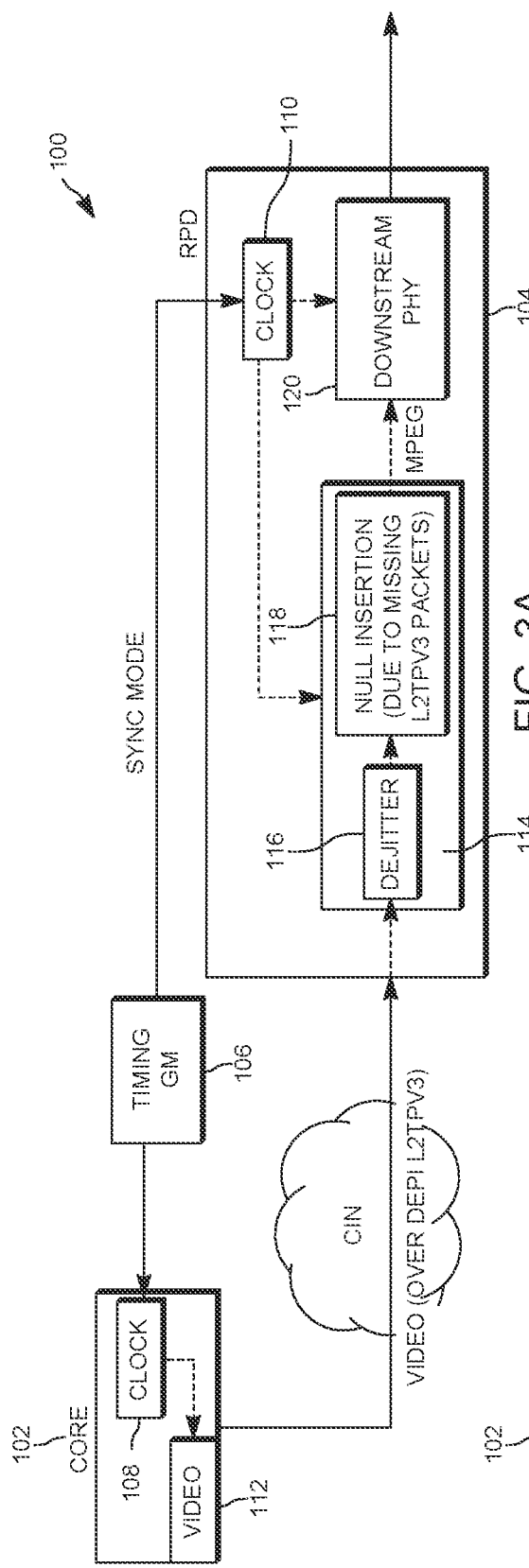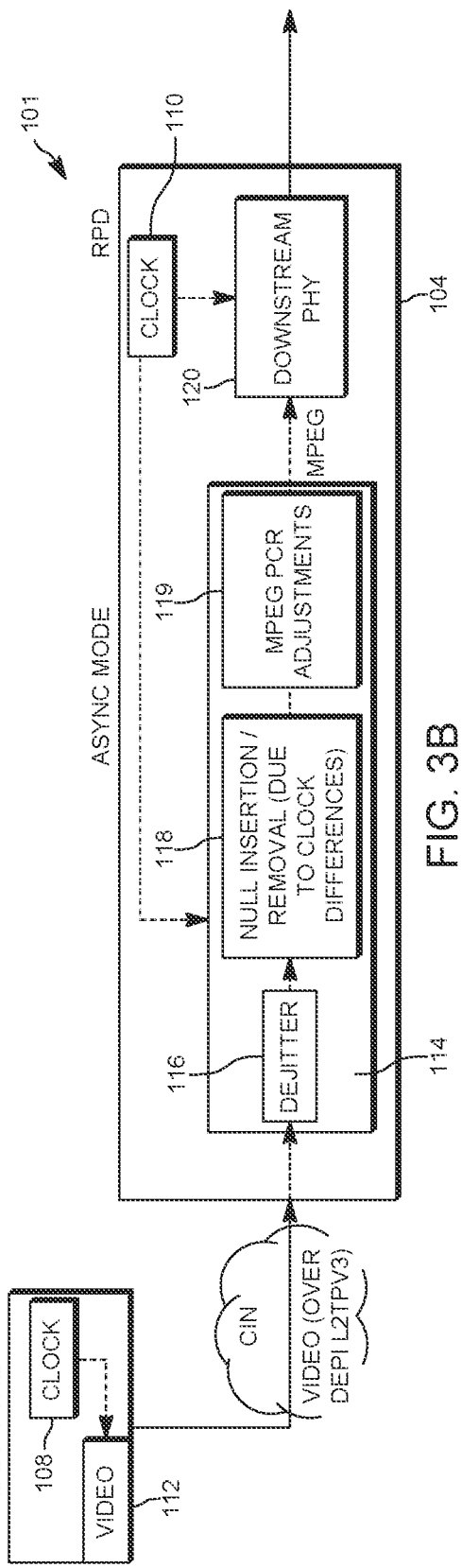

ADAPTIVE VIDEO SLEW RATE FOR VIDEO DELIVERY

CROSS REFERENCE TO RELATED APPLICATIONS

The present application is a continuation of U.S. patent application Ser. No. 17/989,622, filed Nov. 17, 2022, which is a continuation of U.S. patent application Ser. No. 17/590,365, filed Feb. 1, 2022, now U.S. Pat. No. 11,533,526, which claims the benefit of U.S. Provisional Ser. No. 63/144,367 filed Feb. 1, 2021.

BACKGROUND

The subject matter of this application generally relates to delivery of video content using distributed access architectures (DAA) of a hybrid CATV network, and more particularly to architectures that distribute the functions of the Cable Modem Termination System between a core and a remote device synchronized to the core, such as a Remote PHY device or Remote MACPHY device.

Although Cable Television (CATV) networks originally delivered content to subscribers over large distances using an exclusively RF transmission system, modern CATV transmission systems have replaced much of the RF transmission path with a more effective optical network, creating a hybrid transmission system where cable content terminates as RF signals over coaxial cables, but is transmitted over the bulk of the distance between the content provider and the subscriber using optical signals. Specifically, CATV networks include a head end at the content provider for receiving signals representing many channels of content, multiplexing them, and distributing them along a fiber-optic network to one or more nodes, each proximate a group of subscribers. The node then de-multiplexes the received optical signal and converts it to an RF signal so that it can be received by viewers. The system in a head end that provides the video channels to a subscriber typically comprises a plurality of EdgeQAM units operating on different frequency bands that are combined and multiplexed before being output onto the HFC network.

A traditional HFC architecture includes a head end having a Cable Modem Termination System (CMTS), used to provide high speed data services, such as video, cable Internet, Voice over Internet Protocol, etc. to cable subscribers. Typically, a CMTS will include both Ethernet interfaces (or other more traditional high-speed data interfaces) as well as RF interfaces so that traffic coming from the Internet can be routed (or bridged) through the Ethernet interface, through the CMTS, and then onto the optical RF interfaces that are connected to the cable company's hybrid fiber coax (HFC) system. Downstream traffic is delivered from the CMTS to a cable modem in a subscriber's home, while upstream traffic is delivered from a cable modem in a subscriber's home back to the CMTS. Many modern HFC CATV systems have combined the functionality of the CMTS with the video delivery system in a single platform called the Converged Cable Access Platform (CCAP).

In these traditional HFC architectures, the video is modulated onto the RF network by a video Edge QAM (VEQ). A VEQ receives Internet-Protocol (IP) encapsulated Single & Multiple Program Transport Streams (SPTSs & MPTSs) from various sources (unicast/multicast) and, after removing any jitter from the network ingress stream, statically or dynamically maps these streams onto a QAM channel via one or more ports of the VEQ, remapping program identifiers (PIDs), while multiplexing as necessary individual SPTSs into a single MPTS. The VEQ may also perform local encryption of the video's elementary streams (ESs). To deliver an MPTS stream onto a QAM channel in accordance with ISO 13818-1 requires that the VEQ recover the ingress Program Clock Reference (PCR) values encoded within each SPTS and re-stamp it with the VEQ's internal 27 MHz clock so that all streams are delivered with the same time base.

As networks have expanded and head ends have therefore become increasingly congested with equipment, many content providers have recently used distributed architectures to spread the functionality of the CMTS/CCAP throughout the network. This distributed architecture keeps the cable data and video signals in digital format as long as possible, extending the digital signals beyond the CMTS/CCAP deep into the network before converting them to RF. It does so by replacing the analog links between the head end and the access network with a digital fiber (Ethernet/PON) connection.

One such distributed architecture is Remote PHY (R-PHY) distributed access architecture that relocates the physical layer (PHY) of a traditional CMTS or CCAP—including the VEQs—by pushing the physical layer to the network's fiber nodes. Thus, while the core in the CMTS/CCAP performs the higher layer processing, the R-PHY device in the node converts downstream video data packets sent by the core from digital to analog to be transmitted on radio frequency, and also converts the upstream RF data sent by cable modems from analog to digital format to be transmitted optically to the core. Another distributed access architecture is Remote MAC PHY (R-MACPHY) where, not only is the physical layer of the traditional CMTS pushed into the network, but the functionality Media Access Control (MAC) layer, which is one of the two layers that constitute the data link layer of a transport stream, is also assigned to one or more nodes in the network in what is called a Remote MACPHY device (RMD).

In DAA architectures, it is therefore the remote video capable devices, such as an RMD and RPD, that include the VEQs that modulate a fully formed MPTS stream, sent by a core, onto the RF network. One benefit of this arrangement is that RMD/RPD devices are generally lower power than a traditional Video Edge QAMs located in a head end, and need lower computational and memory resources. Similar to a VEQ located in a head end, a VEQ located in an RPD/RMD must map and modulate an IP-encapsulated, fully formed MPTS video stream it receives from a head end onto one or more QAM channels (one stream per channel), removing network jitter in the process. The difference relative to a VEQ in a head end, however, is that a VEQ in a remote device only receives a fully-encapsulated MPTS stream, hence does not need to multiplex together various SPTS content.

Also, in DAA architectures, however, because the functionality of the CMTS/CCAP is divided between a core in the head end and various PHY or MACPHY devices throughout the network, protocols must be established to accurately preserve the timing of reconstructed video data that is communicated throughout the network. Thus, even though a remote device only receives MPTS video data already synchronized together, the remote device still must account for any difference between the clock rate at which it receives data and the clock rate at which it outputs data. For example, the DAA remote device may not be synchronized to the same time base as that of the CCAP core (asynchronous operation), or even where the CCAP core and the remote device are synchronized to a common clock (synchronous operation) the CCAP core and the remote device may lose their timing lock.

What is desired therefore, are improved systems and methods for accurately preserving timing information associated with video data transmitted in distributed access architectures.

BRIEF DESCRIPTION OF THE DRAWINGS

For a better understanding of the invention, and to show how the same may be carried into effect, reference will now be made, by way of example, to the accompanying drawings, in which:

FIG. 3A shows an exemplary system where the video/CCAP core of FIG. 2 transmits video data to the RPD in sync mode.

FIG. 3B shows an exemplary system where the video/CCAP core of FIG. 2 transmits video data to the RPD in async mode.

DETAILED DESCRIPTION

Figure 1:
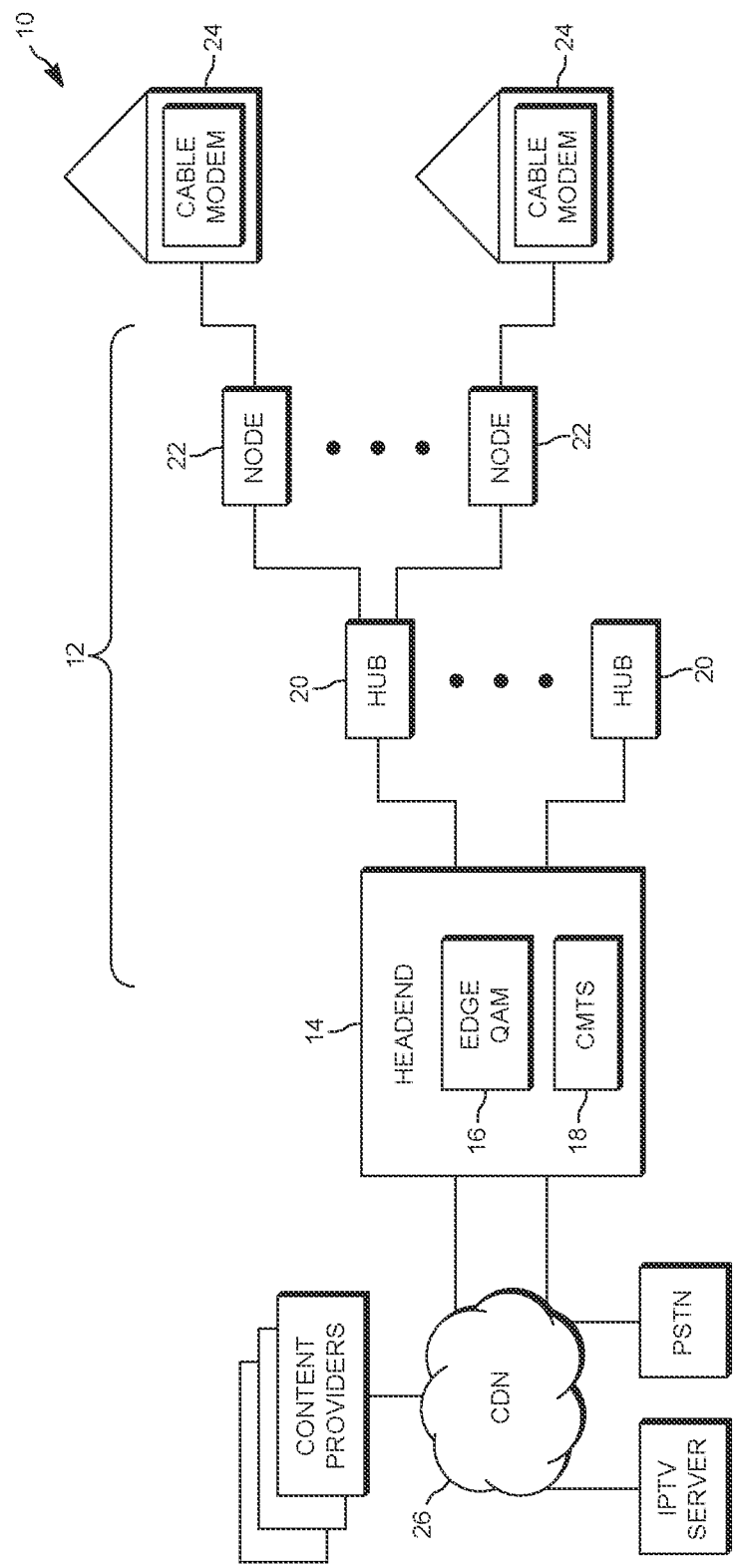
FIG. 1 shows an exemplary traditional HFC architecture having video EQAM units, which package MPTS transport streams to send to downstream nodes.

As noted previously, video EQAM (VEQ) devices are used to receive a large number of channels of video, and output an RF-modulated (i.e. QAM or quadrature amplitude modulated) signal combining the multiple different channels that the VEQ receives. FIG. 1, for example, shows a traditional architecture 10 by which an HFC network 12 includes a head end 14 that delivers content to subscriber equipment 24 as subscriber premises, shown in the figure as a cable modem but those of ordinary skill in the art will understand that subscriber equipment could include set-top boxes, gateways, wireless phones, computers, etc.

The HFC network 12 includes a head end 14, a plurality of hubs 20, and associated with each hub, a plurality of nodes 22 and a plurality of subscriber equipment 24 such as cable modems. The head end 14 typically includes a cable modem termination system (CMTS) 13 and a plurality of video EQAM units 16. Each of the nodes 22 has one or more corresponding access points, and each subscriber may have one or more corresponding network elements 24, shown in FIG. 1 as a cable modem.

As also noted previously, in these traditional HFC architectures 10, video is modulated onto the RF network by VEQs 16, which receives Internet-Protocol (IP) encapsulated Single & Multiple Program Transport Streams (SPTSs & MPTSs) from various sources (content providers, etc.) through content delivery network 26. The content delivery network is typically a switching network by which packetized IP data is routed from one address to another and may exhibit unpredictable and variable delays in the packets received. Therefore, the VEQ 16 preferably removes this jitter from the network ingress stream before mapping and modulating the video data onto a plurality of QAM channels. As also noted earlier, to deliver an MPTS stream onto a QAM channel in accordance with ISO 13818-1 requires that the VEQ recover the ingress Program Clock Reference (PCR) values encoded within each SPTS and re-stamp it with the VEQ's internal 27 MHz clock so that all streams are delivered with the same time base.

Figure 2:
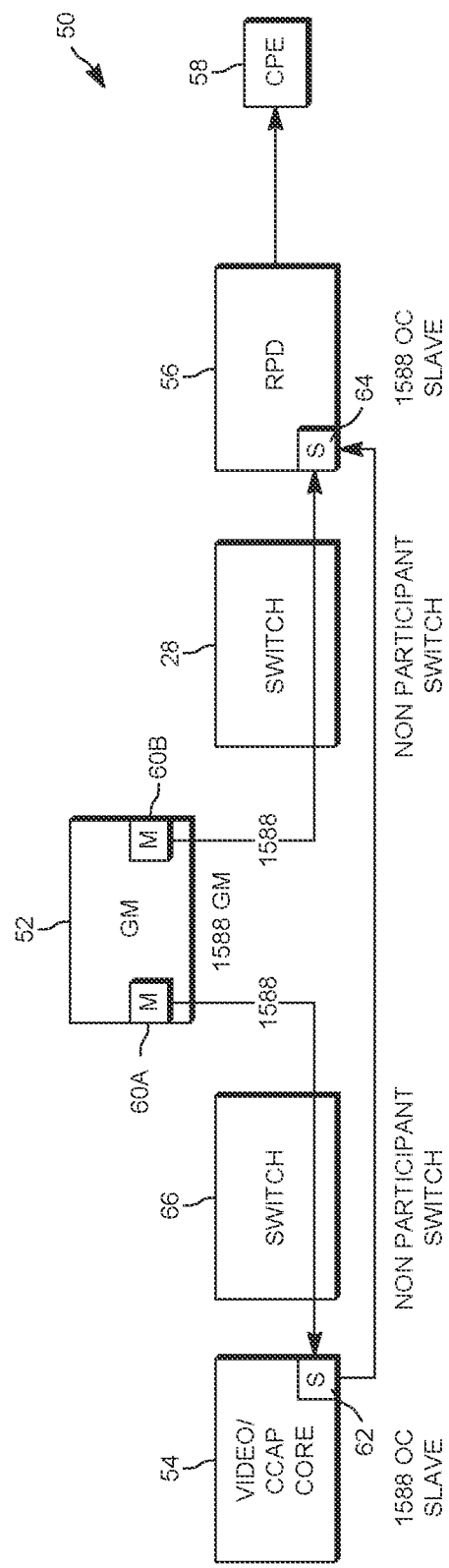
FIG. 2 shows an exemplary distributed access architecture that includes a video/CCAP core that sends packetized IP data to a remote physical device (RPD).

FIG. 2 shows an alternate distributed access architecture (DAA) in which the functionality of the VEQ is moved to a node. Specifically, FIG. 2 shows what is known as n Remote-Physical Architecture (R-PHY) 50 in which a video/CCAP core 54 sends data to a Remote Physical Device (RPD) 56, which is in turn connected to one or more "consumer premises equipment (CPE) devices 18 such as a set-top box, cable modem, etc. Though an R-PHY architecture is illustrated in FIG. 2, it should be understood that the description herein is equally applicable to other DAA architectures, such as R-MACPHY architectures, for example. In some embodiments, a timing grandmaster device 52 may be available to provide timing information to both the video/CCAP core 54 and the RPD 56. Specifically, the timing grandmaster 52 has a first master port 60a connected to a slave clock 62 in the CCAP core 54 and a second master port 60b connected to a slave clock 64 in the RPD 56, though alternatively the respective slave clocks of the CCAP core 54 and the RPD 56 may both be connected to a single master port in the timing grandmaster device 52. The CCAP core 54 may be connected to the timing grandmaster 52 through one or more switches 66 while the RPD 56 may be connected to the timing grandmaster 52 through one or more switches 68. Although FIG. 2 shows only one RPD 56 connected to the timing grandmaster 52, many such RPDs may be simultaneously connected to the grandmaster 52, with each RPD having a slave clock 64 receiving timing information from a port 60b in the grandmaster clock 52.

Even though the architecture of FIG. 2 shows a common grandmaster device 52 capable of synchronizing the video/CCAP core 54 to the RPD 56, the architecture of FIG. 2 may be also configured to operate asynchronously, where the grandmaster device 52 does not send common timing information to the core 54/RPD 56. For example, the RPD 56 may be configured to operate asynchronously if the video/CCAP core 54 does not support IEEE1588 timing protocols, or if the RPD 56 is desired to be more resilient to holdover periods in the case the RPD and/or the core loses connection to the timing grandmaster. Moreover, in an R-MACPHY system, an RMD will typically be set to async mode by default to eliminate the need for 15888 timing, since DOCSIS services do not need it although the RMS may instream be switched to sync mode if other services such as wireless backhaul requires IEEE 1588 services, or if the oscillator of the video core 54 is of poor quality and needs an external timing source. Therefore, the system shown in FIG. 2 may be configured to either operate in sync mode or in async mode to process video content, and the video/CCAP core 54 and RPD (RMD) 55 each therefore preferably include hardware capable of operating in either mode, with software that enables configuration by a video core of itself and connected downstream devices into either alternate one of these modes when setting up video channels.

In sync (synchronous) mode, the RPD (or RMD) and its video core are synchronized in time to the same reference clock. In this sync mode, the RPD is required merely to detect lost video packets using the Layer 2 Tunneling Protocol v. 3 (L2TPv3) sequence number monitoring and insert MPEG null packets for each missing packet. FIG. 3A, for example, shows a system in a first configuration 100 where a video core 102 communicates with an RPD 104 in synchronous mode using a common grandmaster timing server 106. The timing server 106 maintains an identical timing lock (i.e., frequency and phase) with both the clock 108 in the video core 102 and the clock 110 in the RPD 104. The video core 102 has a video streamer 112 that forwards video data packet to the RPD 104 via a Downstream External PHY Interface (DEPI) using L2TPv3. The video packets sent from the video core 102 to the RPD 104 will typically include all information necessary to decode the packetized elementary video transport stream, such as Program Identifiers (PIDs), Program Clock Reference (PCR) data, etc.

The RPD 110 in turn, receives the video packets sent from the video core 108 in a dejitter buffer 116 of a processing device 114. The dejitter buffer 116 receives and outputs packet data at a rate that removes network jitter resulting from differing paths of received packet data, or other sources of varying network delay between the video core and the RPD. Because some packets sent by the video streamer 112 may be lost or misplaced during transport to the RPD 104, the packets output from the dejitter buffer 116 may preferably be forwarded to a module 118 that, in the case of sync mode, inserts null packets in the data stream to account for those lost packets, so as to maintain the proper timing rate of the transmitted video. The transport stream, with any necessary insertion of null packets is then forwarded to a PHY device 120, which may decode the packetized elementary stream into a sequence of decoded video frames for downstream delivery to end-users by outputting QAM-modulated data in a format expected by customer-premises equipment, like set-top boxes. Alternatively, the PHY device may simply forward the packetized data, without decoding, to e.g., a cable modem for decoding by a user device such as a computer, tablet, cell phone, etc.

In sync mode, because the RPD 104 and its Video Core 102 must be synchronized to the same reference clock, the frequency of the PCR clock contained within the ingress MPTS matches that of the local clock on the remote device. Therefore, there is no frequency offset on the RPD between the ingress and egress streams, and as noted earlier, to maintain proper timing information in the video data being transmitted, the RPD 104 need only remove network jitter, detect lost video packets using the L2TPv3 Sequence number monitoring, and insert MPEG NULL packets for each missing packet.

Alternatively, however, the RPD and video core may be configured to operate in an asynchronous (async) mode. In async mode, the RPD 104 and its video core 102 are not synchronized in time to the same reference clock. Instead, the RPD 104 is required to detect the difference between its own clock 110 and the clock 108 of the video core 102 and be able to either insert or remove MPEG packets as necessary to maintain expected MPEG bitrate, and also adjust the MPEG PCR values due to the removal/insertion of the MPEG packets.

FIG. 3B, for example, shows the hardware of FIG. 2 configured to instead operate in async mode. In this configuration 101, the clock 108 of the video core 102 and the clock 110 of the RPD 104 are not synchronized and may therefore drift relative to each other. The video streamer 112 of the video core 102 forwards packets of the packetized video data elementary stream to the RPD 104, which again receives the data in dejitter buffer 116 to remove network jitter, as described previously. However, unlike the configuration of FIG. 2, the packets output from the dejitter buffer 116 are forwarded to the module 118 which both adds null packets when needed, and drops packets when needed, in order to maintain the proper constant bit rate of the data received from the dejitter buffer 116.

Further, because the RPD and its video core are not synchronized in time to the same reference clock, the frequency of the PCR in the ingress MPTS will be offset from that of local RPD clock. Thus, as well as performing the above functions common to those performed in sync mode, the RPD must also detect the magnitude of the frequency offset from the video core and correct for it. To this end, after packets are added/dropped as needed, a PCR module 119 re-stamps the data packets with updated PCRs due to the removal/insertion of MPEG packets before forwarding the re-stamped packets to the PHY device 120.

Another consideration in async mode is the limited size of the dejitter buffer. Since an offset between the ingress frequency and the egress frequency exists, left unchecked the jitter buffer may tend to overflow/empty depending on the sign of the frequency difference. Therefore, systems and methods must be employed to prevent the buffer from either overflowing or emptying. The subsequent disclosure discloses novel methods of detecting and correct for this frequency offset in async mode of operation, taking into consideration its limited memory (buffer) size, while simultaneously maintaining an accurate synchronization of the video data being processed.

As already noted, network jitter is removed by using a 'dejitter' buffer 116 shown in FIG. 3B. This dejitter buffer 116 is preferably filled initially to its mid-point as the MPTS stream delivery starts. Dejitter is usually accomplished using a low-pass filter that averages delays over a sufficiently long interval, hence the dejitter buffer 116 is preferably sized large enough to absorb the fluctuations in the buffer depth caused by jitter on the ingress stream without underflowing or overflowing.

Frequency differences between the ingress PCR and the local RPD clock (i.e. the egress rate) will manifest as a drift on the de-jitter buffer depth after low-pass filtering. This will produce the drift rate of the queue depth caused by the frequency offset. This drift rate is directly proportional to the frequency offset between the ingress PCR and the local clocks Specifically, ingress frequency Fi is directly proportional to the ingress bitrate Bi $$F_i \alpha B_i$$

and the output frequency Fo is directly proportional to the egress bitrate Bo $$F_0 \alpha B_0$$

where the differential between the ingress and egress frequencies is expressed in terms of a dimensionless parts-per-million (PPM) frequency offset.

$$\frac{F_i - F_0}{F_0} \times 10^6 = \triangle ppm.$$

$$\text{Therefore, } \frac{F_i}{F_0} = \frac{B_i}{B_0}$$

$$\frac{F_i}{F_0} - 1 = \frac{B_i}{B_0} - 1$$

$$\frac{F_i - F_0}{F_0} = \frac{B_i - B_0}{B_0}$$

-continued $$\frac{\Delta ppm}{10^6} = \frac{B_i - B_0}{B_0} \text{ where } \frac{F_i - F_0}{F_0} \times 10^6 = \Delta ppm$$

$$\frac{\Delta ppm}{10^6} = \frac{\frac{dQ}{dt}}{B_0}$$

where dQ/dt is rate of change of queue depth $$\frac{dQ}{dt} = \frac{\Delta ppm}{10^6} B_0. \quad \text{(Eqn. 1)}$$

To halt the growth/depletion in the dejitter buffer occupancy, the RPD must slew its egress frequency to match the ingress frequency. ISO/IEC 13818-1 mandates a maximum value for this frequency slew rate. Therefore, the value of the system clock frequency, measured in Hz, should and shall meet the following constraints:

27 000 000−810<=system clock frequency<=27 000 000+810 rate of change of system clock frequency with time<=75× 10-3 Hz/s

A typical frequency offset for a hardware-based video engine is +/−5 ppm. However, for a software-based video engine where the timing is given by a standard crystal-based oscillator, this accuracy is likely to be substantially less than that. The ISO13818-1 spec allows for a +/−810 Hz accuracy on the 27 MHz clock, which equates to a 30 ppm offset. If the video core 102 were to deliver a MPTS asynchronously, with a 30 ppm frequency offset and the RPD clock offset were 5 ppm, in the opposite direction, the relative frequency offset would be 35 ppm.

If no correction was done on this frequency offset, the time taken to hit a buffer overrun/underrun condition is dependent on the size of the dejitter buffer in the RPD device. The available working depth of the dejitter buffer is given by:

Qlen/2−Jmax, where Jmax is the max jitter

Therefore, if no frequency correction is applied, the time overflow/underflow the dejitter buffer is given by:

$$t = \left(Q_{len}/2 - J_{max}\right)/\frac{dQ}{dt}$$

and by substituting from Eq. 1, $$t = \left(Q_{len}/2 - J_{max}\right)/\left(\frac{\Delta ppm}{10^6} B_0\right) \quad \text{(Eq. 2)}$$

Systems and methods described herein preferably slew the egress frequency to match that of the ingress frequency, at a high enough rate that will prevent the dejitter buffer from overflowing/underflowing, and do so at a rate that is as close as possible to the 75 mHz/S limit, although if the buffer size is limited, the actual frequency slew rate may have to exceed this limit.

As mentioned previously, VEQs generally recover the PCR clock of the ingress streams, apply the required slew to correct for any frequency offset between that clock and the local VEQ 27 MHz clock, and re-stamp the PCRs output from the VEQ with this corrected clock. An alternative to re-stamping PCRs may be to apply an accumulating offset to each PCR that compensates for the frequency offset. When this accumulating PCR offset exceeds the transmission time of a single Transport Stream Packet (TSP), a TSP can be added/removed from the egress MPTS stream and the PCR offset value can be adjusted back towards zero by this transmission time:

$$PCR \text{ ticks per } TSP = \frac{188 * 8 * 27 * 10^6}{QAM \text{ channel bitrate}}. \quad \text{Eqn. 3}$$

The frequency offset applied may preferably vary over time until the ingress and egress MPTS bitrate are equal, i.e., synchronized. This initial rate of change of the PCR offset is proportional to the observed frequency slew seen on the egress stream. Avoiding the need for an RPD/RMD to recover and re-stamp the MPTS PCR clocks, beneficially removes a large computational and memory overhead.

The frequency slew rate applied is dependent on an estimation of the ppm frequency offset. As shown previously, the frequency offset is directly proportional to the rate of change of the dejitter buffer occupancy i.e., Eq. 1. Therefore, after a short setting period during which high frequency network jitter can be averaged out, the rate of change of the dejitter buffer occupancy can be calculated, thereby giving an approximation of the current ppm frequency offset. According to preferred systems and methods disclosed in the present specification, this frequency offset may be reduced/eliminated over time in a manner that does not result in a buffer overrun/underrun. More specifically, preferred embodiments as herein described employ an adaptive frequency slew rate adjustment, which means varying the frequency slew over time based upon a measured state of the dejitter buffer. In some embodiments, the measured state of the dejitter buffer may indicate a current frequency offset, and that may be the basis of varying the slew over time. Alternatively, or additionally, the measured state of the dejitter buffer may be based on the remaining available buffer occupancy.

Figure 4:
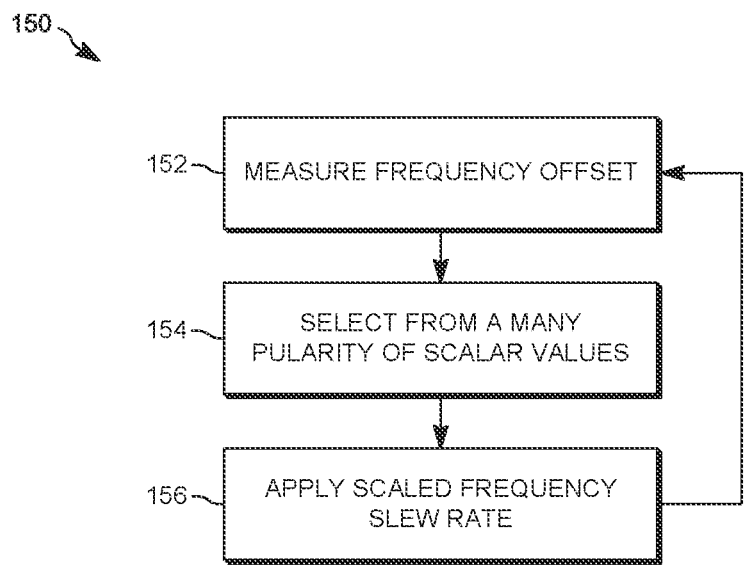
FIG. 4 shows a first exemplary method of using an adaptive frequency slew rate to ensure that video data output from the asynchronous system of FIG. 3B is properly synchronized while avoiding buffer overflows.

Referring to FIG. 4, a first embodiment may comprise a method 150 that, at step 152 determines an initial, or current, frequency offset between input data entering the dejitter buffer 116 and output data leaving the dejitter buffer 116. The frequency offset may be determined, for example, by measuring a fullness state of the dejitter buffer 116 over an interval and applying a low pass filter over that interval to determine a drift on the depth of the dejitter buffer. In a preferred embodiment, the grift may be used to determine a current frequency offset value measured in ppm.

In step 154, the determined initial, or current, frequency offset is used to select from a plurality of predetermined scalar slew rate values. As one example, a predetermined slew rate may be associated with each of a plurality of frequency offset ranges, e.g., one slew rate may be applied if the measured frequency offset is less than or equal to 10 ppm, another slew rate may be applied if the measured frequency offset is above 10 ppm but less than or equal to 35 ppm, and a third slew rate may be selected if the measured frequency offset is above 35 ppm. Those of ordinary skill in the art will appreciate that other slew rate values for each of these ranges may be used, and a larger number of ranges may be used in various embodiments. Preferably, the slew rates preselected for each of the ranges are pre-calculated to guarantee that the frequency slew rate is sufficiently high so that the frequency offset is corrected before a dejitter buffer overrun/underrun event occurs.

At step 156 the selected frequency slew rate is applied, and after a period of time has elapsed, the procedure returns to step 152 so that another measurement may be taken of the frequency offset, which will have been reduced relative to the previous iteration, and the method may thereby continue until the frequency offset has been eliminated.

Notably, the rate of change of the dejitter buffer depth will decrease as the frequency offset decreases, so the initial frequency slew rate will have a more dramatic effect on the buffer occupancy. As the frequency offset approaches zero, the chosen slew rate will have less of an effect. Thus, the periodic updating of the frequency slew can be performed at a relative low rate because the frequency offset correction is a relatively slow process (i.e., possibly >60 minutes for large ppm frequency offsets).

Instead of merely adjusting slew rate based upon a frequency offset, as measured by changes to the depth of the dejitter buffer 116, and alternate implementation may adjust a slew rate based upon both the measured frequency offset as well as a measured remaining working depth of the dejitter buffer. In some specific embodiments, a calculation may be used to determine a stepwise change in slew rate as a function of a measured frequency offset and a measured state of the working depth of a buffer. For example, slew rate (dF/dT) may be based on a fractional measured frequency drift as flows:

$$\frac{dF}{dt} = +/- (D \cdot F)$$

where D is the freq drift rate as a fraction $$\frac{dF}{dt}/F$$

$$\int \frac{dF}{F} = \int +/- D\, dt$$

$$\ln(F) = +/- D.t + const$$

$$F_t = e^{+/-D.t+const}$$

$$F_t = F_0 e^{+/-D.t}, \text{ where } F_0 = e^{const}$$

$$\ln(F_t/F_0) = +/- D.t$$

$$+/- D = \ln(F_t/F_0)/\left((Q_{len}/2 - J_{max})/\left(\frac{\Delta ppm}{10^6} B_0\right)\right)$$

(substituting from *Eq.* 2)

$$+/- D = \left(\ln(F_t/F_0) \cdot \frac{\Delta ppm}{10^6} B_0\right)/(Q_{len}/2 J_{max})$$

Thus, a selected frequency slew rate can be represented by the equation $$\frac{dF}{dt} = \left(\left(\ln(F_t/F_0) \cdot \frac{\Delta ppm}{10^6} \cdot B_0 \cdot F_0\right)/(Q_{len}/2 - J_{max})\right) * S \quad \text{(Eq. 4)}$$

where S is a linear approximation for the low-pass filter's Phase Locked Loop (PLL) (e.g. S=0.5).

The value ($Q_{len}/2 - J_{max}$) represents the available working depth of the buffer, where $Q_{len}/2$ represents the time averaged (jitter removed) distance the buffer is from being completely full or completely empty, and Jmax represents the maximum experienced jitter. Thus, application of this equation can produce a desired initial/updated slew rate based on a measured frequency offset and a measured available working depth of the buffer.

Figure 5:
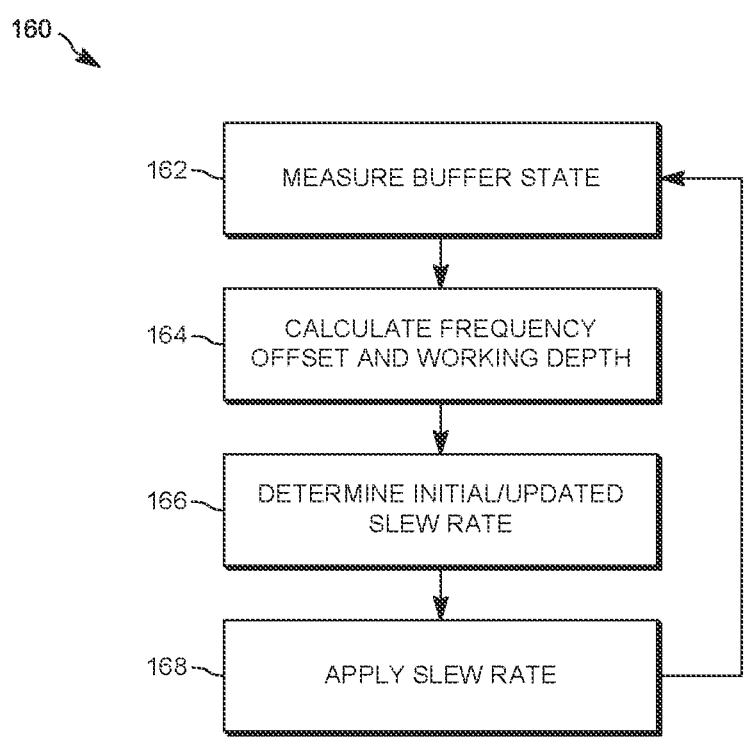
FIG. 5 shows a second exemplary of using an adaptive frequency slew rate to ensure that video data output from the asynchronous system of FIG. 3B is properly synchronized while avoiding buffer overflows.

Referring to FIG. 5, for example, another embodiment for applying an adaptive frequency slew rate to a dejitter buffer may use method 160 in which at step 162 a buffer state is measured over an interval of time sufficient to average out network jitter so as to determine drift in the buffer due to a frequency offset.

At step 164, from the measurements taken in step 162, values are calculated for a measured frequency offset between data entering and exiting the buffer, as well as for a working buffer depth, which in some embodiments, will reflect a maximum amount of jitter. At step 166 an initial/updated slew rate is determined. In some embodiments, the slew rate may be determined based on Eqn. 4, above. AT step 168 the determined slew rate is applied. After a period of time, the procedure then reverts to step 162 and continues until the frequency offset has been eliminated.

Figure 6A:
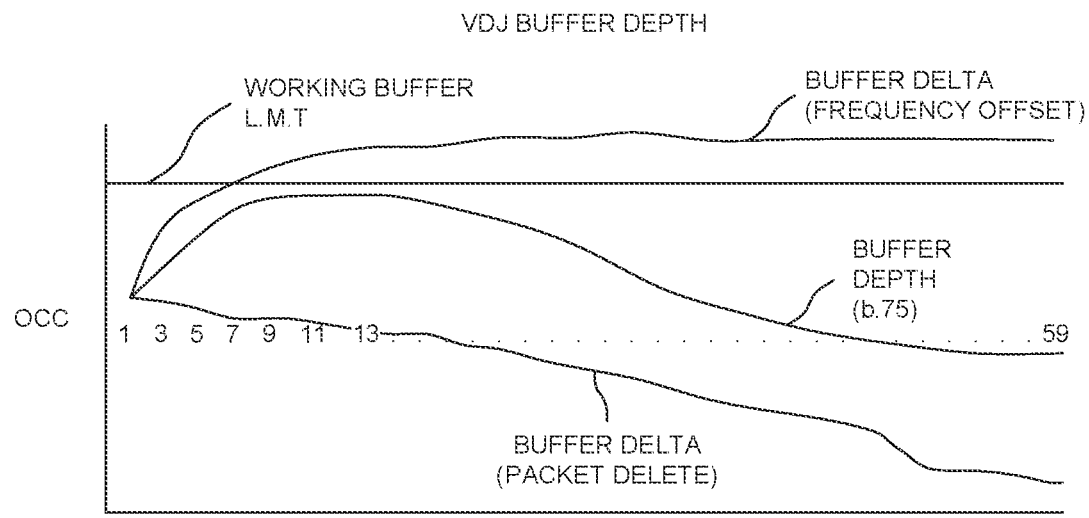
FIGS. 6A and 6B show the results of using the adaptive frequency slew rates as disclosed herein.
Figure 6B:
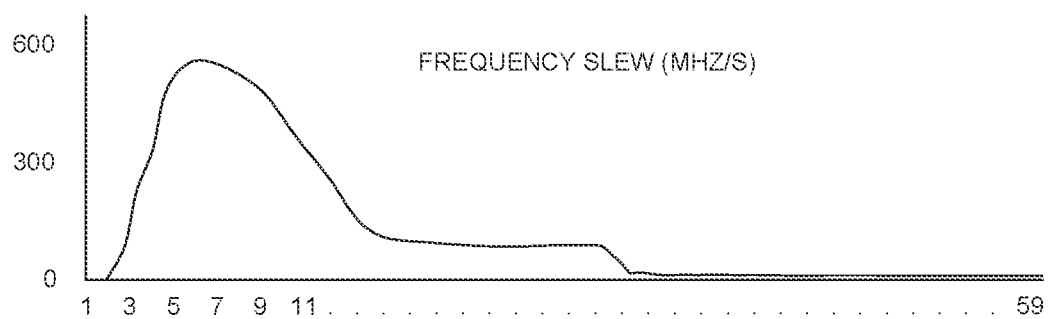

FIGS. 6A and 6B show the results of the systems and procedures described in this specification. These figures show that the disclosed systems and methods quickly adjust to prevent buffer underruns/overruns, while also eliminating frequency offset across a jitter buffer over time.

Once the adaptive frequency slew process described above is completed, the egress frequency will match that of the ingress frequency. This implies that the ingress and egress bitrates will also match, and therefore the drift on the depth of the dejitter buffer 116 is eliminated. However, the dejitter buffer 116 will be offset from its center point, while for optimal performance of the dejittering function, the dejitter buffer should be maintained at a 50% fullness state.

To recenter the dejitter buffer 116, the RPD/RMD 104 can utilize the allowable tolerance on the PCR accuracy to accumulate DOCSIS ticks, which will facilitate the addition/removal of TSPs to/from the egress stream. ISO/IEC 13818-1 defines this PCR tolerance as "the maximum inaccuracy allowed in received PCRs. This inaccuracy may be due to imprecision in the PCR values or to PCR modification during remultiplexing. It does not include errors in packet arrival time due to network jitter or other causes. The PCR tolerance is +/−500 ns."

Applying a deliberate +/−500 mS error to successive PCRs, on a per PID basis, equates to adjusting the PCR value by +/−13.5 ticks i.e. ($500 \times 10^{-9} \times 27 \times 10^6$). Once this accumulated value exceeds the PCR ticks per TSP value (see Eq. 3), a packet can be added/removed from the egress stream and the PCR adjust value incremented/decremented by the PCR ticks per TSP value. Repeating this process, will allow the dejitter buffers to be gradually re-centered, without contravention of the ISO 13818-1 specification.

The foregoing specification described systems and methods by which one embodiment of an RPD/RMD 204 operating in async mode within a DAA architecture could apply a PCR offset to incoming video rather than restamp the video data with time values from its own clock as a less-computationally intensive means of maintaining synchronized presentation of the video data. Those of ordinary skill in the art, however, will appreciate that all of the foregoing techniques can also be applied by a VEQ unit in a head end as shown in FIG. 1, for example.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. A remote device that receives packetized video data from a video core through a packet-switched network, the device comprising:
   a clock configured to allow operation in asynchronous mode;
   a dejitter buffer that receives the video data from the packet-switched network and when operating in async mode outputs the video data to at least one module that adjusts the video data before sending the video data in a downstream direction;
   a processing device that when operating in async mode, applies a slew rate adjustment to the clock and the dejitter buffer, the slew rate adjustment varying over time based on a measured state of the dejitter buffer.

2. The remote device of claim 1 comprising an RPD.

3. The remote device of claim 1 comprising an RMD.

4. The remote device of claim 1 where the slew rate adjustment is based on a frequency offset determined by measuring a fullness state of the dejitter buffer over time.

5. The remote device of claim 4 where the slew rate adjustment is based on a measured current fullness state of the dejitter buffer.

6. The remote device of claim 1 where the at least one module applies an offset value to a PCR value in the video data received from the packet switched network.

7. The remote device of claim 6 where the offset values are accumulated to produce an accumulated offset value, the accumulated offset value used to selectively add and/or selectively drop packets.

8. The remote device of claim 7 where the magnitude of the accumulated offset value is reduced whenever a packet is selectively dropped and/or added.

9. The remote device of claim 1 where the slew rate adjustment eliminates a frequency offset by measuring a fullness state of the dejitter buffer repeatedly over time.

10. The remote device of claim 9 where the dejitter buffer is recentered after the frequency offset is eliminated.

* * * * *